United States Patent
Hsieh et al.

(10) Patent No.: US 8,253,451 B1
(45) Date of Patent: Aug. 28, 2012

(54) CLOCK DATA RECOVERY USING PHASE ACCUMULATION OVER A TIME PERIOD DEFINED BY A NUMBER OF CYCLES OF A CLOCK SIGNAL

(75) Inventors: Cheng Hsiang Hsieh, Los Gatos, CA (US); Mengchi Liu, Fremont, CA (US); Yu Xu, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 106 days.

(21) Appl. No.: 12/817,126

(22) Filed: Jun. 16, 2010

(51) Int. Cl.
*H03L 7/00* (2006.01)
(52) U.S. Cl. .......... 327/141; 327/157; 327/161
(58) Field of Classification Search .......... 327/141, 327/157, 161
See application file for complete search history.

(56) References Cited

U.S. PATENT DOCUMENTS 7,453,968 B2 * 11/2008 Chang et al. .......... 375/355

OTHER PUBLICATIONS

Allen, J, "Lecture 200—Clock and Data Recovery Circuits", Jun. 26, 2003, 16 pp., available at http://users.ece.gatech.edu/~jskenney/L200-CDR-I(2UP).pdf.

* cited by examiner

*Primary Examiner* — John Poos
(74) *Attorney, Agent, or Firm* — W. Eric Webostad

(57) ABSTRACT

A clock data recovery module and a method of operation thereof are described. In an embodiment, a data stream is received. Transitions in the data stream are detected to provide phase signaling for indicating phase relationships to the transitions detected. A lock detector receives the phase signaling. The lock detector accumulates phase information from the phase signaling and temporarily stores an accumulated total of the phase information representative of a code change, and the lock detector determines whether the code change is within a set range over a time period and resets the accumulated total at a conclusion of the time period.

18 Claims, 6 Drawing Sheets

CLOCK DATA RECOVERY USING PHASE ACCUMULATION OVER A TIME PERIOD DEFINED BY A NUMBER OF CYCLES OF A CLOCK SIGNAL

FIELD OF THE INVENTION

An embodiment of the invention relates to integrated circuit devices ("ICs"). More particularly, an embodiment of the invention relates to clock data recovery for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Conventionally, to have valid communication between a transmitter and a receiver, a lock condition for a clock data recovery ("CDR") module is used. A CDR is conventionally used to control operation of a phase interpolator ("PI"). In short, before data from a PI is considered valid, a lock condition for the CDR is used. If a recovered phase is not phase-locked, then output of a phase detector tends to be in the same direction of the out-of-lock condition, either up or down. If, however, a recovered phase is phase-locked, then conventionally a phase detector output is generally at or about 50/50, namely 50 percent up and 50 percent down.

However, lock conditions are susceptible to phase drift between transmit ("TX") and receive ("RX") clock signals. It should be understood that conventionally there is some phase drift between TX and RX clock signals. This phase drift may be for example 100 cycles in 1 million cycles, or some other ratio. However, heretofore it may not have been known how much a current RX clock has drifted from an associated TX clock. For example, a registered phase value of a filter at the beginning of a sample window and a registered phase value of such filter at the end of such a sample window may have been obtained to provide a difference thereof. This would provide a magnitude of a phase difference; however, because of phase drift, this magnitude may be significantly in error. Furthermore, magnitude of such out-of-lock condition may not be well understood due to a wraparound condition of code input to the PI.

Accordingly, it would be desirable and useful to provide a more accurate CDR module.

SUMMARY OF THE INVENTION

One or more embodiments generally relate to clock data recovery.

An embodiment relates generally to a clock data recovery module. In such an embodiment, a phase detector receives a data stream and provides phase signaling for indicating phase relationships to transitions in the data stream. A lock detector receives the phase signaling. The lock detector accumulates phase information from the phase signaling and temporarily stores an accumulated total of the phase information representative of a code change, and the lock detector determines whether the code change is within a set range over a time period and resets the accumulated total at a conclusion of the time period.

In another embodiment of a clock data recovery module two phase detectors may be used. In such an embodiment, a first phase detector and a second phase detector receive a data stream. The first phase detector provides first phase signaling for indicating phase relationships to transitions in the data stream. The second phase detector provides second phase signaling for indicating the phase relationships to the transitions in the data stream. A lock detector receives the first phase signaling. The lock detector accumulates phase information from the first phase signaling and temporarily stores an accumulated total of the phase information representative of a code change. The lock detector determines whether the code change is within a set range over a time period and resets the accumulated total at conclusion of the time period.

Yet another embodiment relates generally to a method for operation of a clock data recovery module. In such an embodiment, a data stream is received at a phase detector. Transitions in the data stream are detected to provide phase signaling for indicating phase relationships to the transitions detected. Phase information is accumulated from the phase signaling and an accumulated total of the phase information representative of a code change is temporarily stored. Whether the code change is within a set range over a time period is determined. The accumulated total is reset at a conclusion of the time period.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
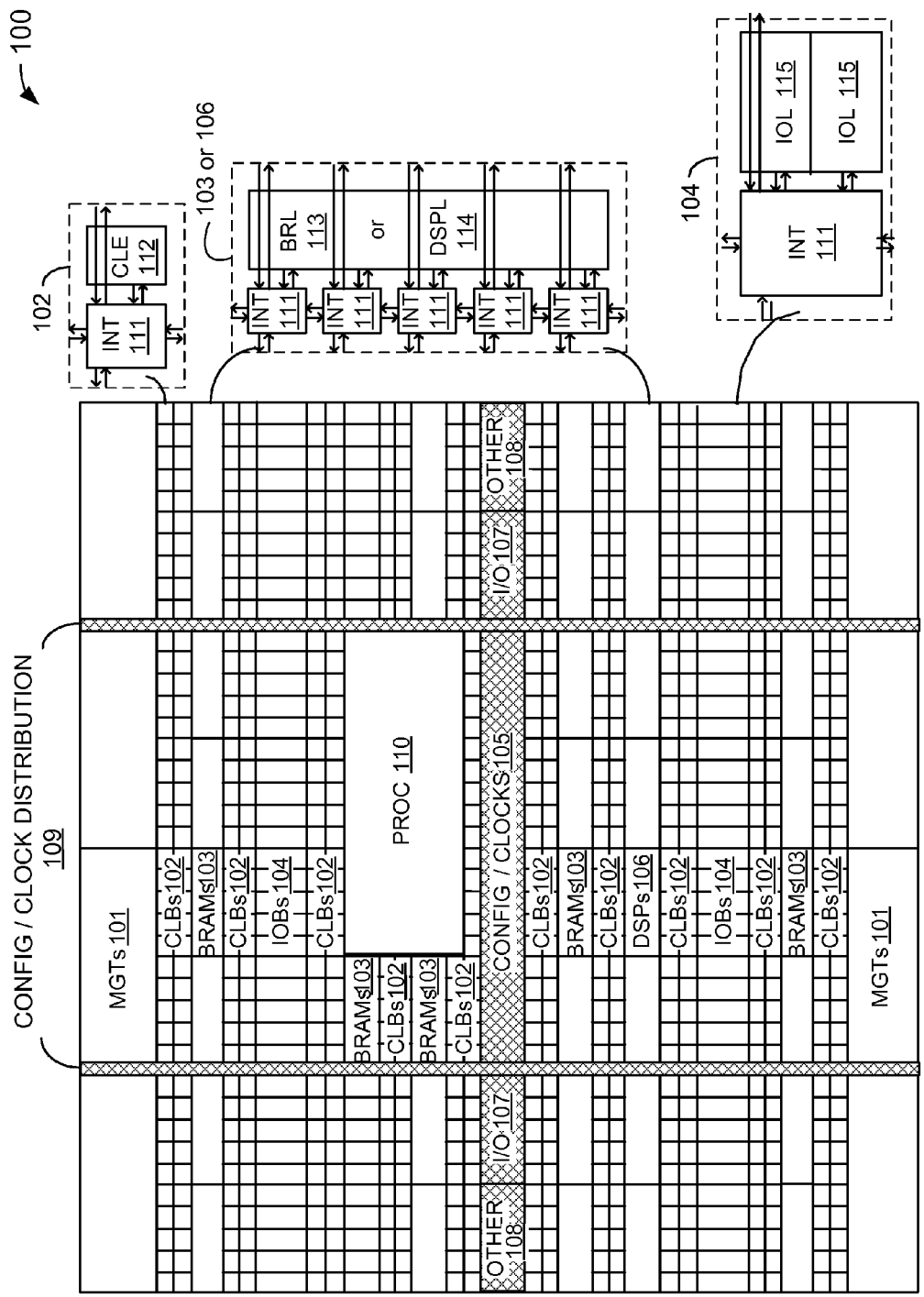
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

In the following description a clock data recovery module is described, which may be implemented in whole or in part using programmable logic of an FPGA. However, for purposes of clarity by way of example and not limitation, such clock data recovery module is described as implemented with dedicated logic.

Figure 2:
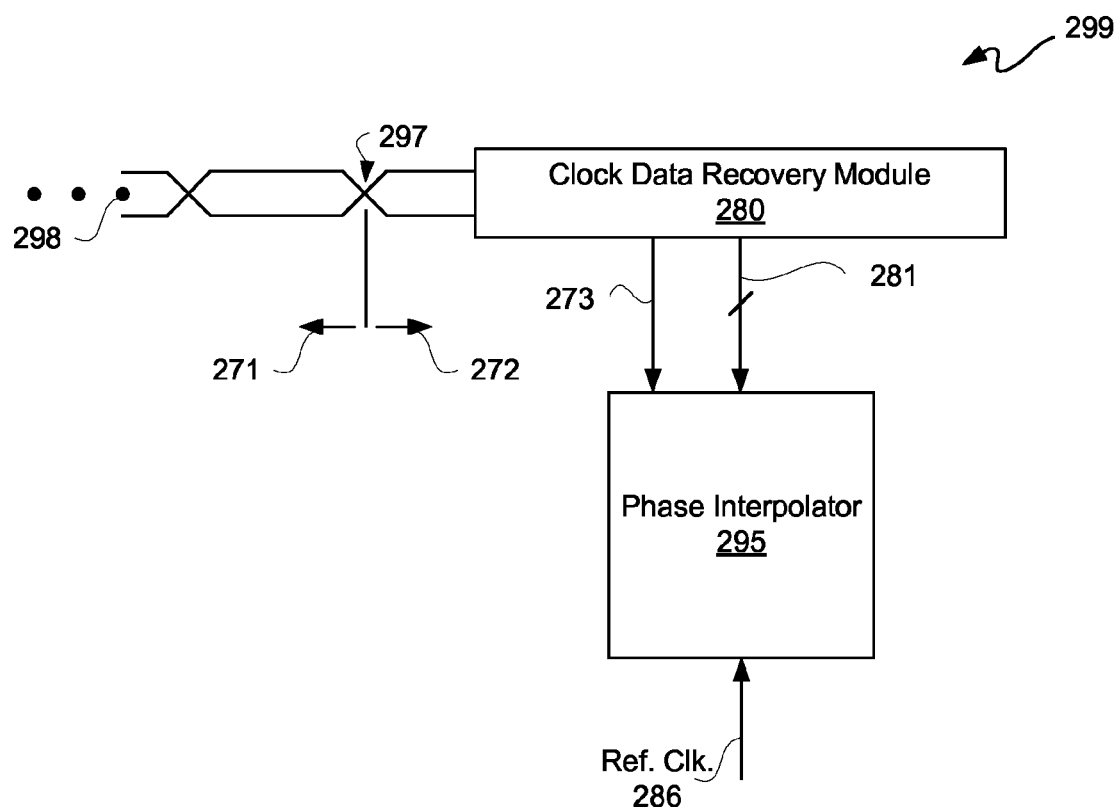
FIG. 2 is a block diagram depicting an exemplary embodiment of a receiver front end.

FIG. 2 is a block diagram depicting an exemplary embodiment of a receiver front end 299. Receiver front end 299 includes clock data recovery module 280 and phase interpolator 295. While a conventional phase interpolator may be implemented, a phase interpolator may be used as described in a co-pending U.S. patent application entitled "PHASE INTERPOLATOR" by Cheng Hsiang Hsieh and Mengchi Liu hereof, filed Jun. 16, 2010, assigned application Ser. No. 12/817,111, which is incorporated by reference herein in its entirety for all purposes.

Clock data recovery module 280 may be coupled to receive data stream 298. Data stream 298 may be for differential serial data. Transitions, such as transition 297 for example, may be data crossings of such differential serial data.

Output of clock data recovery module 280 may be a coded output 281, such as a binary coded output or other coded output, for a phase interpolator 295. Another output from clock data recovery module 280 may be lock signal 273.

Phase interpolator 295 may be coupled to receive a reference clock signal 286, binary coded output 281, and lock signal 273. In this exemplary embodiment, binary coded output 281, which is provided as input to phase interpolator 295, is seven (7) bits wide; however, it should be understood that other bit widths may be used that are longer or shorter than 7 bits, as may vary from implementation-to-implementation.

Figure 6:
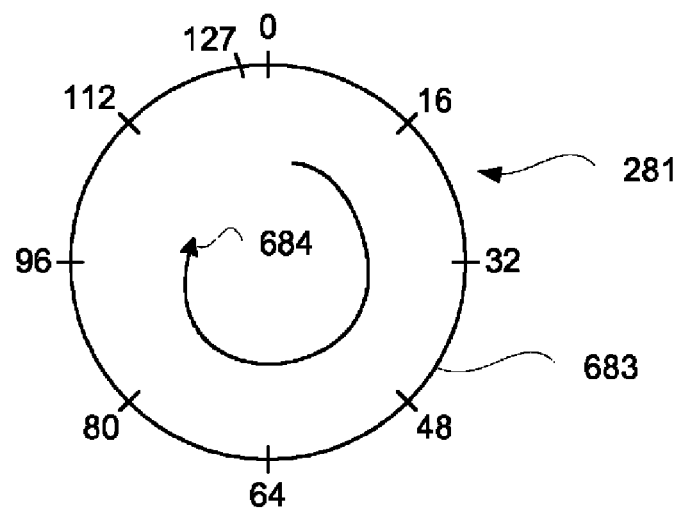
FIG. 6 is a circular diagram for depicting wraparound of binary coded output.

Binary coded output 281 wraps around, namely is a "wraparound code." For purposes of clarity by way of example and not limitation, FIG. 6 is a circular diagram for depicting wraparound of binary coded output 281. For the depicted 7 bit embodiment, numerical values from 0 to 127 sequentially disposed about a circle 683 represent possible output values of binary coded output 281. This sequential progression is generally indicated by arrow 684.

For the example of a 7-bit binary value for assigning phase, there may be 128 possible values for phase from 0 to 360 degrees. Because of wraparound, it should be understood that the value after value 127, namely the sequentially next binary coded output value, is not 128, but rather is 0. Thus, a maximum jump may erroneously be assumed to be from 0 to 360 degrees, because at 360 degrees the value is 0, namely the next phase. Therefore, binary code output is effectively converted to a sinusoidal bit code by use of a reset and a window for determining a change in code magnitude, as described below in additional detail.

Figure 3A:
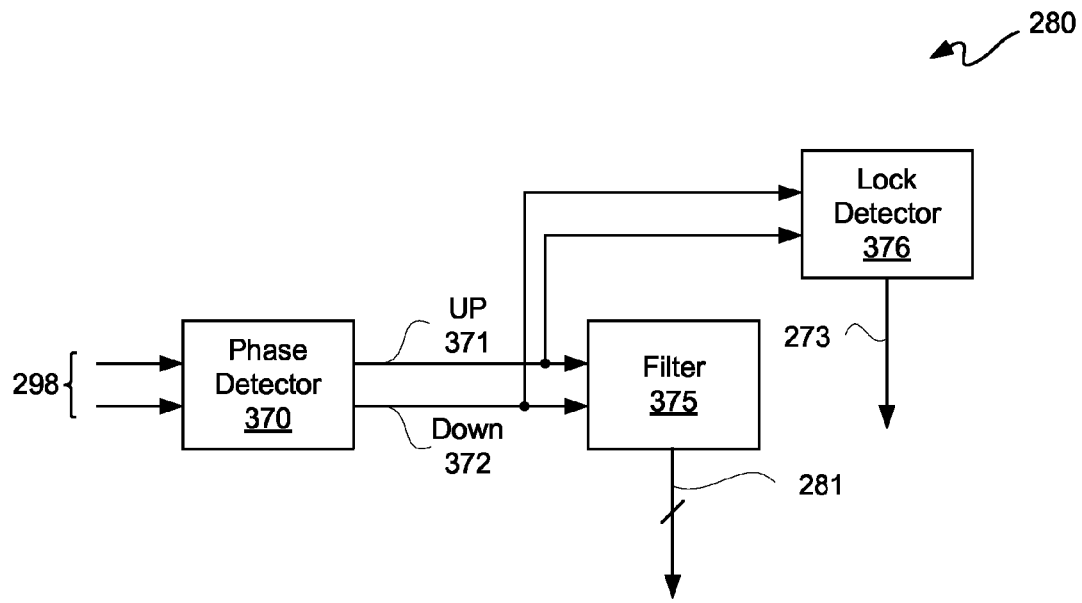
FIG. 3A is a block diagram depicting an exemplary embodiment of clock data recovery ("CDR") module.

FIG. 3A is a block diagram depicting an exemplary embodiment of clock data recovery ("CDR") module 280. CDR 280 includes phase detector 370, filter 375, and lock detector 376. Phase detector 370, which may be a conventional phase detector, is coupled to receive a data stream, such as data stream 298. Phase detector 370 is configured to provide phase signaling as an output for indicating phase relationships to detected data transitions in data stream 298. While the example of data crossings is used herein, it should be understood that other types of data transitions may be used, such as edge detection, zero crossings, and the like. CDR module 280 is further described with simultaneous reference to FIGS. 2 and 3A.

Filter 375 is coupled to receive up signal 371 and down signal 372 from phase detector 375. Filter 375 is configured to provide coded output 281 responsive to signals 371 and 372. Output of filter 375 may be binary coded output 281.

Phase detector 370 may be configured to provide an up signal 371 increment when phase is behind a detected data transition and a down signal 372 increment when phase is ahead of a detected data transition. However, other types of phase signaling may be used.

Lock detector 376 and filter 375 are both coupled to receive up signal 371 and down signal 372. Output of lock detector 376 is lock signal 273. For purposes of clarity by way of example and not limitation, it shall be assumed that lock signal 273 is logic high when asserted to indicate a locked condition of CDR 280 with respect to a phase of data stream 298. Thus, it shall be assumed that lock signal 273 is logic low when not asserted to indicate an unlocked or out-of-lock condition of CDR 280 with respect to a phase of data stream 298. However, an active low implementation may be used.

For purposes of clarity by way of example and not limitation, it will be assumed that at least a 75/25 or 25/75 up-to-down or down-to-up ratio for phase detector 370 output over 10,000 cycles is a lock condition. Thus, a 60/40 up-to-down or down-to-up ratio would be a lock condition for example. However, in this embodiment, this is a user settable value, and thus may vary from implementation-to-implementation. Furthermore, the number of cycles for evaluation of whether a lock condition exists in this embodiment is a user settable value, and thus likewise may vary from implementation-to-implementation. Thus, for this example, if 76 or more ups are counted for each 24 or less downs of up signal 371 and down signal 372, respectively, over 10,000 cycles, then an unlocked condition would exist, and vice versa. Likewise, if 75 to 25 ups are counted for each 25 to 75 downs of up signal 371 and down signal 372, respectively, over 10,000 cycles, then a locked condition would exist.

Again, it should be understood that there is some phase drift between receive ("RX") and transmit ("TX") clock signals. This phase drift may be for example 100 cycles in 1 million cycles, or some other ratio. However, if filter 375 is used without lock detector 376 it may not be possible to know how much phase drift there is between associated TX and RX clock signals.

However, by making a CDR module 280 with a lock detector 376, which may be modeled after filter 375 of such CDR module 280, a reliably accurate phase difference may be determined, provided, however, that at the beginning of each detection sample window a phase command input to phase interpolator 295 is effectively set/reset to 0. In other words, detection sample window history is effectively periodically "flushed." Thus, a registered value at the beginning of each detection sample window is zero, and so magnitude of phase difference is such registered value at the end of a detection sample window. Filter 375 and lock detector 376 may have equivalent accumulators; however, the accumulator of lock detector 376 is periodically flushed.

Using the above example of a 75/25 or 25/75 up/down ratio for a lock or locked condition centered to a 50/50 ratio where ups are counted as plus 1 and downs are counted as minus 1, a lock condition would exist provided magnitude of phase difference is within for example +25 and −25, inclusive, for a detection sample window. The sign bit can be ignored, because only magnitude of phase difference may be considered for whether a lock condition exists. Again, this lock range may be user selectable, namely how much phase movement is allowed for an application may be set by a user.

Figure 3B:
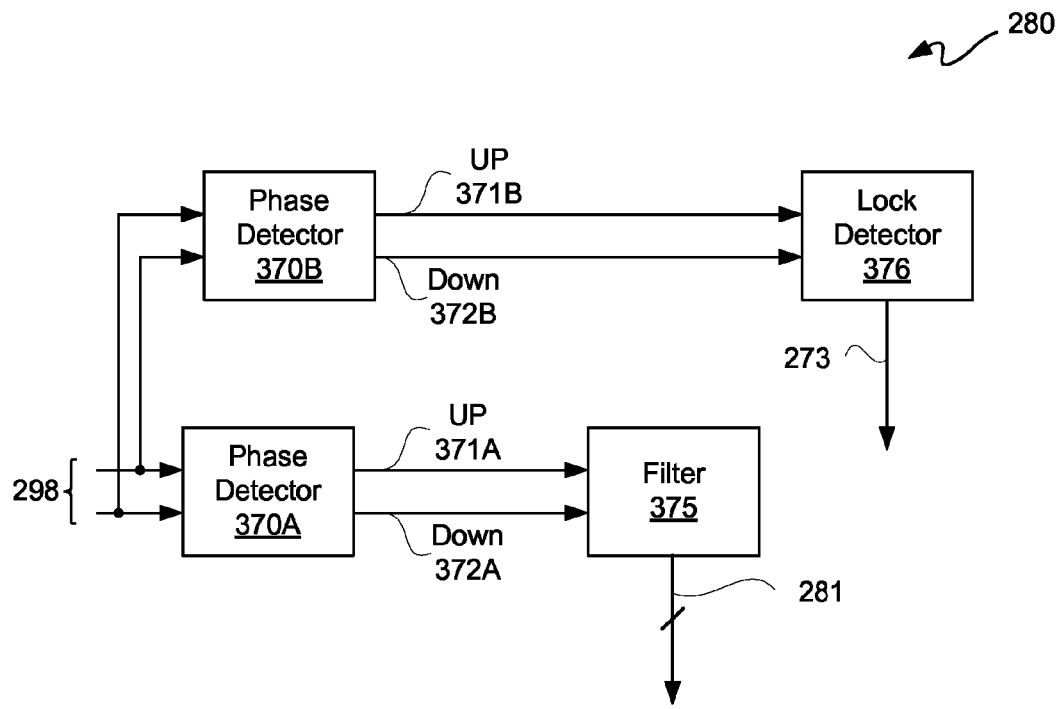
FIG. 3B is a block diagram depicting another exemplary embodiment of a CDR module.

FIG. 3B is a block diagram depicting another exemplary embodiment of a CDR module 280. With simultaneous reference to FIGS. 2 and 3B, CDR module 280 of FIG. 3B is further described.

CDR 280 includes phase detectors 370A and 370B, filter 375, and lock detector 376. Phase detectors 370A and 370B may generally be copies of one another, both of which may be coupled to receive a data stream, such as data stream 298. For high-speed serial applications, performance may be limited due to loading effects. Accordingly, by having two phase detectors, such as phase detectors 370A and 370B, coupled to receive data stream 298, fanout loading effects may be mitigated to enhance performance.

Phase detector 370A provides up signal 371A and down signal 372A to filter 375. Phase detector 370B provides up signal 371B and down signal 372B to lock detector 376. In this embodiment, lock detector 376 and filter 375 of FIG. 3B are the same as in FIG. 3A, and thus same description is not repeated for purposes of clarity.

It should be understood that CDR 280 of FIG. 3B may generally be thought of as two CDR modules coupled to receive a single data stream, where one of such CDR modules is configured to provide a lock detection signal, such as lock signal 273, and the other of such CDR modules is configured to provide a coded output, such as binary coded output signal 281. Signals 273 and 281 may be input to a phase interpolator, such as phase interpolator 295.

Figure 4:
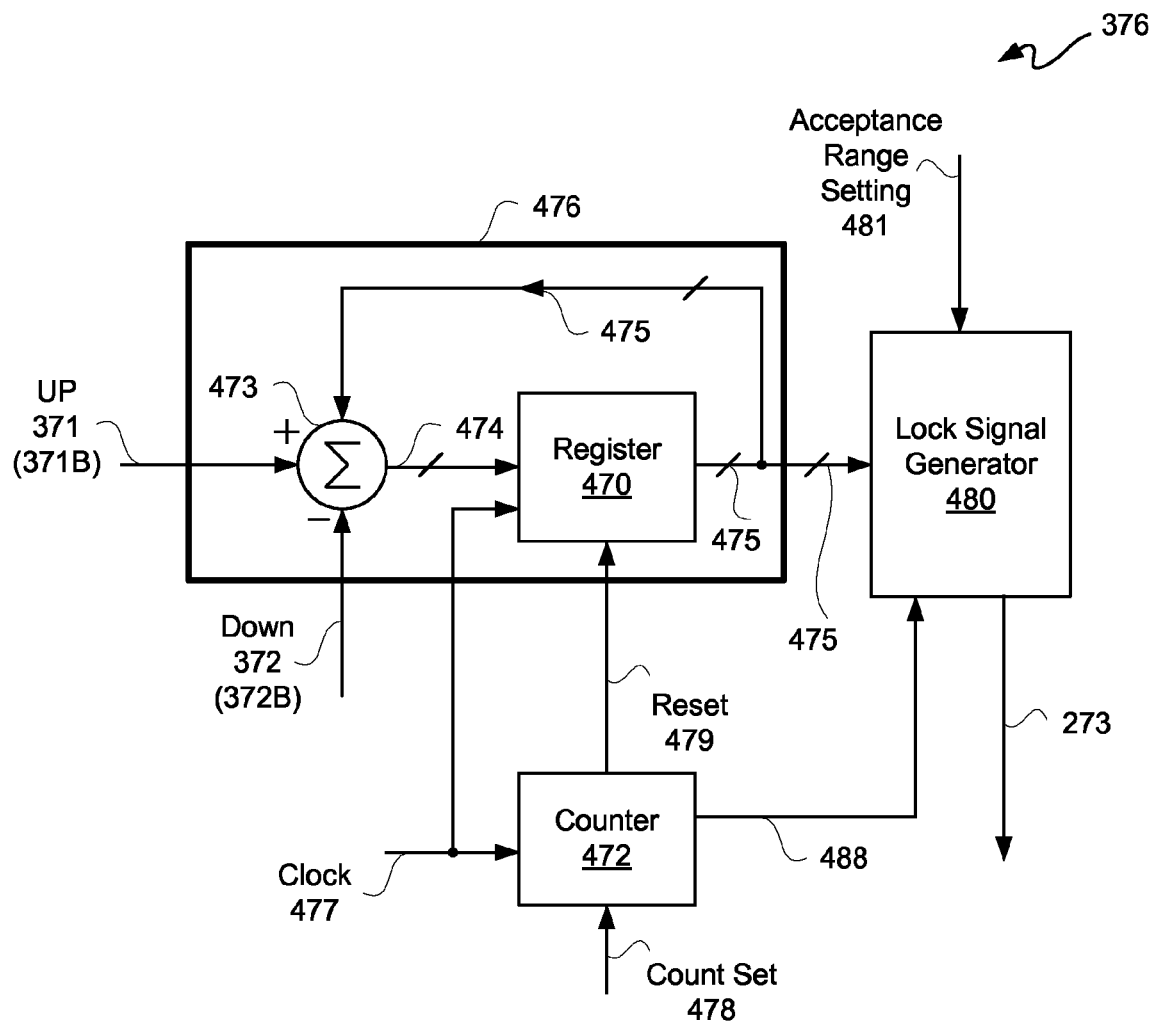
FIG. 4 is a block diagram depicting an exemplary embodiment of lock detector.

FIG. 4 is a block diagram depicting an exemplary embodiment of lock detector 376. With simultaneous reference to FIGS. 2, 3A, 3B, and 4, lock detector 376 is further described.

Again, lock detector 376 is coupled to receive phase signaling, such as up signal 371 or 371B (hereinafter "371") and down signal 372 or 372B (hereinafter "372"). Lock detector 376 includes an accumulator 476, a lock signal generator 480, and a counter 472. Counter 472 may be part of lock signal generator 480 but is shown separately for purposes of clarity and not limitation. Lock detector 376 is configured to accumulate information from phase signaling, such as up signal 371 and down signal 372, to temporarily store an accumulated total responsive thereto. This accumulated total represents a code change, namely a difference in phase magnitude.

In this embodiment, accumulator 476 accumulates information from up signal 371 by adding each up increment, such as an increment of plus one for each up detected, and from down signal 372 by subtracting each down increment, such as an increment of minus one for each down detected, to provide an accumulated total, namely to provide a code change associated with a phase magnitude change.

Accumulator 476 includes register 470 and summer 473. Up signal 371 is provided to a plus port of summer 473, and down signal 372 is provided to a minus port of summer 473. However, optionally, plus and minus of up and down inputs may be reversed. Another input to summer 473 is a currently accumulated total 475 output from register 470.

Register 470 is coupled to receive newly accumulated total 474 output from summer 473. Additionally, register 470 may be coupled to receive and be clocked by clock signal 477. Clock signal 477 may also be provided to counter 472. An output from counter 472 is provided as a reset signal 479 to register 470. Reset signal 479 is used to reset register 470. Reset signal 479 may be asserted generally at the conclusion of a current count, and then de-asserted thereafter for a next count, and so on. Output 475 from register 470 is provided to lock signal generator 480, in addition to being fed back as an input summer 473.

Counter 472 may be coupled to receive a count set signal 478. Count set signal 478 may be for setting counter 472 to count up to a number, and then returning to counting from a starting number to provide a time period. Such time period may be used for determining whether a lock condition exists for such time period, as described below in additional detail. Continuing the above example, counter 472 may be set responsive to input from counter set signal 478 to count from 0 to 10,000, such as 10,000 cycles of clock signal 477 for example. Optionally, counter 472 may be manufactured with a default count value, which may be used instead of or in addition to a user settable count value via count set signal 478.

Once counter 472 reaches a set or default count value, counter 472 asserts reset signal 479. Responsive to reset signal, register 470 is reset, such as reset to zero. In other words, prior phase signaling history stored in accumulator 476 is flushed. Furthermore, once counter 472 reaches such set or default count value, counter 472 asserts a count complete signal 488. For purposes of clarity by way of example and not limitation, reset signal 479 and count complete signal 488 are illustratively depicted as separate signals; however signals 479 and 488 may be the same signal provided to both reset register 470 and activate lock signal generator 480. Count complete signal 488 may be asserted generally at the conclusion of a current count then de-asserted thereafter for a next count, and so on.

Lock signal generator 480 is coupled to receive a lock acceptance range setting signal 481. Lock acceptance range signal 481 is used to load a lock acceptance range in lock signal generator 480. Optionally, lock signal generator 480 may be configured with a default lock acceptance range. Whether a user set or default lock acceptance range is used, lock signal generator 480 compares a currently accumulated total 475 to such lock acceptance range. Continuing the above example, suppose a user set acceptance range is for a range of +25 to −25. If a currently accumulated total 475 is in a range of 0 to 25, inclusive, then a lock condition exists. However, if such a currently accumulated total 475 is not in a range of 0 to 25, inclusive, then a lock condition does not exist. It should be understood that because only a magnitude is used, a sign bit may be ignored. In other words, direction of slope, increasing or decreasing, may be ignored for purposes of determining whether a lock condition exists for a symmetric lock range centered at 50/50, and thus only a positive half of such an acceptance range may be set in lock signal generator 481. It should further be understood that accumulated total 475 is compared with lock acceptance range for assertion, or not, of lock signal 273 before accumulated total 475 is reset to 0 responsive to assertion of reset signal 479. Lock signal 273 may be asserted or de-asserted generally after conclusion of a current count. Lock signal 273 thus may continue to be either asserted or de-asserted generally until the conclusion of a next count, and so on.

Optionally, if a user could set an asymmetric lock range centered at 50/50 in lock signal generator 480. In such an embodiment, a sign bit output from register 470 could be used for determining whether a currently accumulated total 475 was within an asymmetric lock acceptance range.

Accordingly, it should be understood that lock detector 376 is configured to determine whether code change, represented by a currently accumulated total after a period of time is within a set range for such a time period. It should further be understood that lock detector 376 is configured to reset such code change upon ending of such time period, such that no history remains. Thus, phase drift over time as between RX and TX clocks may be mitigated in determining whether a phase lock condition exists. Additionally, lock detector 376 may be configured to assert a lock signal responsive to a code change being within a set range immediately after conclusion of such time period. Lastly, because history stored in accumulator 476 is flushed within a reasonable period of time, which may vary from application-to-application, such change in code may not cross a wraparound condition threshold. In other words, count set by count set signal 478 for example may generally be sufficiently small so as not to encounter a wraparound condition of coded output 281, such as was described with reference to FIG. 6 for example. Thus, erroneous phase magnitude results may be avoided.

Figure 5:
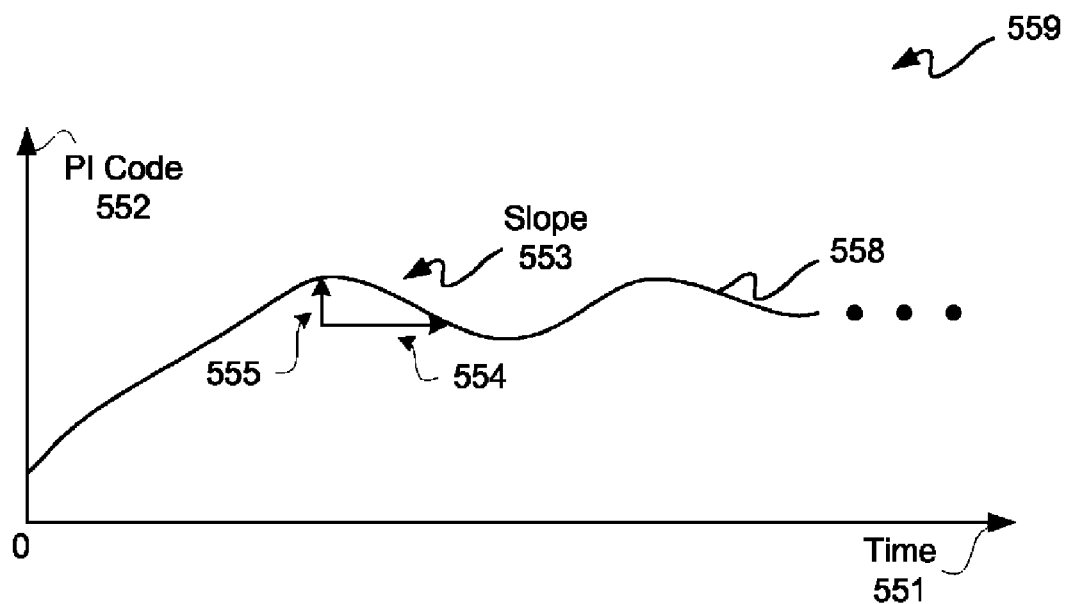
FIG. 5 is a graphical diagram depicting an exemplary embodiment of phase change.

FIG. 5 is a graphical diagram depicting an exemplary embodiment of phase change 559. Phase change 559 may be represented as a change in phase interpolator ("PI") code along y-axis 552 over time along x-axis 551. Thus, phase change 559 which is plotted as curved line 558 for this example may be expressed as the slope of a section of line 558, name change 555 in PI code over change 554 in time. Of course instantaneous phase change would be the slope of a line tangent to line 558; however, counter 472 may count a number of clock cycles of clock signal 447 to a set count provided via count signal 478. This may be used to define change in time 554. Because register 470 is reset after each completed count, namely after each count time period, accumulated total 475 may be reset to zero. Thus, magnitude of phase change, namely change 555 in PI code, is a current accumulated total 475 minus an initial accumulated total, namely 0 for example due to reset to 0 in this embodiment. Thus, in this embodiment, change 555 in PI code is a current accumulated total 475. While resetting accumulator 476 to zero has been described, it should be understood than a non-zero reset may be used to bias output of accumulator 476.

Figure 7:
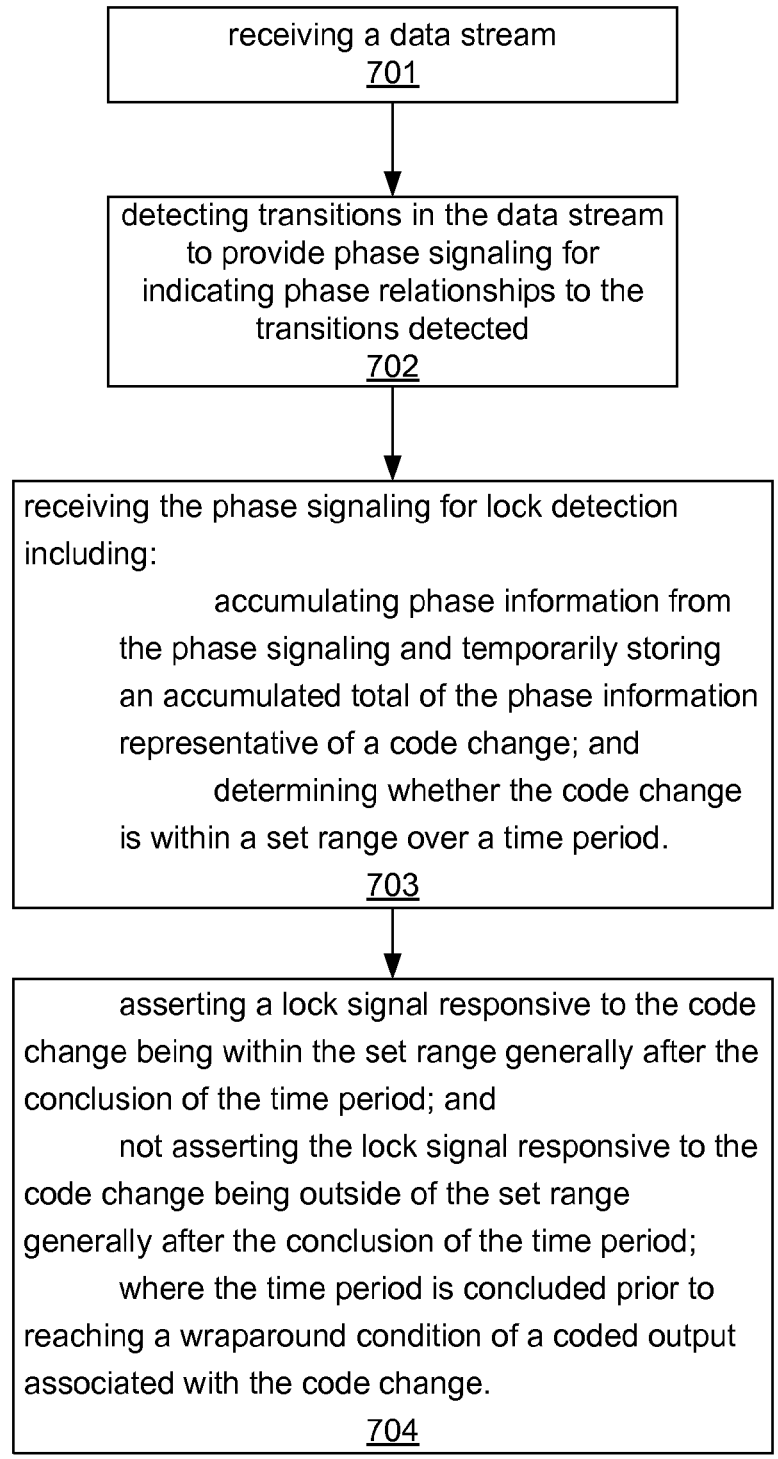
FIG. 7 is a flow diagram depicting an exemplary embodiment a clock data recovery module flow.

FIG. 7 is a flow diagram depicting an exemplary embodiment a clock data recovery module flow 700. At 701, a data stream is received. At 702, transitions in the data stream are detected to provide phase signaling for indicating phase relationships to the transitions detected. At 703, the phase signaling is received for lock detection. Lock detection at 703 may include the following: accumulating phase information from the phase signaling and temporarily storing an accumulated total of the phase information representative of a code change; determining whether the code change is within a set range over a time period; and resetting the accumulated total generally at conclusion of the time period. At 704, a lock signal may be asserted responsive to the code change being within the set range generally after the conclusion of the time period, or not asserted responsive to the code change being outside of the set range generally after the conclusion of the time period. The time period is concluded prior to reaching a wraparound condition of a coded output associated with the code change.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A clock data recovery module, comprising:
a phase detector to receive a data stream and to provide phase signaling for indicating phase relationships to transitions in the data stream;
a lock detector to receive the phase signaling; and
wherein the lock detector accumulates phase information from the phase signaling and temporarily stores an accumulated total of the phase information representative of a code change, and the lock detector determines whether the code change is within a set range over a time period and resets the accumulated total at a conclusion of the time period;
wherein the lock detector includes:
an accumulator to accumulate the phase information from the phase signaling; and
a counter to be set to a count;
wherein the counter increments to the count responsive to cycles of a clock signal; and
wherein the count of the cycles defines the time period.

2. The clock data recovery module according to claim 1, wherein the lock detector further includes:
a lock signal generator to receive the accumulated total from the accumulator;
wherein the lock signal generator determines whether the code change is within the set range.

3. The clock data recovery module according to claim 2, wherein:
the phase detector provides an up signal when detected phase is behind and a down signal when the detected phase is ahead of a detected data transition in the data stream; and
the accumulator adds each increment of the up signal to the accumulated total and subtracts each increment of the down signal from the accumulated total to provide the code change.

4. The clock data recovery module according to claim 3, wherein the transitions are data crossings of differential serial data.

5. The clock data recovery module according to claim 2, further comprising:
a filter to receive the phase signaling;
wherein the filter provides a coded output responsive to the phase signaling.

6. The clock data recovery module according to claim 5, wherein the coded output is a binary coded output for a phase interpolator.

7. The clock data recovery module according to claim 1, wherein:
the coded output has a wraparound condition; and
the conclusion of the time period is prior to reaching the wraparound condition.

8. The clock data recovery module according to claim 2, wherein the lock signal generator asserts a lock signal responsive to the code change being within the set range after the conclusion of the time period and de-asserts the lock signal responsive to the code change being outside of the set range after the conclusion of the time period.

9. The clock data recovery module according to claim 8, wherein the lock signal generator is for receiving a count complete signal from the counter indicating the conclusion of the time period.

10. A clock data recovery module, comprising:
a first phase detector to receive a data stream and to provide first phase signaling for indicating phase relationships to transitions in the data stream;
a second phase detector to receive the data stream and to provide second phase signaling for indicating the phase relationships to the transitions in the data stream;
a lock detector to receive the first phase signaling; and
wherein the lock detector accumulates phase information from the first phase signaling and temporarily stores an accumulated total of the phase information representative of a code change, and the lock detector determines whether the code change is within a set range over a time period and resets the accumulated total at a conclusion of the time period;
wherein the lock detector includes:
an accumulator to accumulate the phase information from the first phase signaling; and
a counter to be set to a count;
wherein the counter increments to the count responsive to cycles of a clock signal; and
wherein the count of the cycles defines the time period.

11. The clock data recovery module according to claim 10, wherein the lock detector further includes:
a lock signal generator to receive the accumulated total from the accumulator;
wherein the lock signal generator determines whether the code change is within the set range.

12. The clock data recovery module according to claim 11, wherein the accumulator adds each increment of the up signal to the accumulated total and subtracts each increment of the down signal from the accumulated total to provide the code change.

13. The clock data recovery module according to claim 12, wherein the transitions are data crossings of differential serial data.

14. The clock data recovery module according to claim 10, wherein:
the coded output has a wraparound condition; and
the conclusion of the time period is prior to reaching the wraparound condition.

15. The clock data recovery module according to claim 11, wherein the lock signal generator asserts a lock signal responsive to the code change being within the set range after the conclusion of the time period and de-asserts the lock signal responsive to the code change being outside of the set range after the conclusion of the time period.

16. The clock data recovery module according to claim 11, wherein the lock signal generator is for receiving a count complete signal from the counter indicating the conclusion of the time period.

17. A method for operation of a clock data recovery module, comprising:
receiving, at a phase detector, a data stream;
detecting transitions in the data stream to provide phase signaling for indicating phase relationships to the transitions detected;
accumulating phase information from the phase signaling and temporarily storing an accumulated total of the phase information representative of a code change;
setting a counter to a count;
counting cycles of a clock signal with the counter;
determining whether the code change is within a set range over a time period; and
resetting the accumulated total at a conclusion of the time period;
wherein the conclusion of the time period is when the count is reached.

18. The method according to claim 17, further comprising:
asserting a lock signal responsive to the code change being within the set range after the conclusion of the time period; and
de-asserting the lock signal responsive to the code change being outside of the set range after the conclusion of the time period; and
wherein the time period is concluded prior to reaching a wraparound condition of a coded output associated with the code change.

* * * * *